(12) United States Patent
Hess et al.

(10) Patent No.: US 10,318,659 B1
(45) Date of Patent: Jun. 11, 2019

(54) SYSTEMS AND METHODS OF DETECTING LOOP CLOSURE IN SIMULTANEOUS LOCALIZATION AND MAPPING (SLAM) APPLICATIONS

(71) Applicant: Google Inc., Mountain View, CA (US)

(72) Inventors: Wolfgang Hess, Munich (DE); Damon Kohler, Bavaria (DE); Holger H. Rapp, Bavaria (DE)

(73) Assignee: Google LLC, Mountain View, CA (US)

( * ) Notice: Subject to any disclaimer, the term of this patent is extended or adjusted under 35 U.S.C. 154(b) by 619 days.

(21) Appl. No.: 14/972,938

(22) Filed: Dec. 17, 2015

(51) Int. Cl.
*G06F 17/50* (2006.01)

(52) U.S. Cl.
CPC .................. *G06F 17/5004* (2013.01)

(58) Field of Classification Search
CPC ................................. G06F 17/5004
USPC ................................................... 703/1
See application file for complete search history.

(56) References Cited

U.S. PATENT DOCUMENTS

| | | | | |
|---|---|---|---|---|
| 8,209,144 B1 * | 6/2012 | Anguelov | ............... | G01C 15/00 702/150 |
| 2004/0193349 A1 * | 9/2004 | Flann | ................... | A01B 69/008 701/50 |
| 2016/0026253 A1 * | 1/2016 | Bradski | ................ | G02B 27/225 345/8 |

OTHER PUBLICATIONS

E. Olson, "M3RSM: Many-to-many multi-resolution scan matching," Proceedings of the IEEE International Conference on Robotics and Automation (ICRA), Jun. 2015.
K. Konolige, G. Grisetti, R. Kümmerle, W. Burgard, B. Limketkai, and R. Vincent, "Sparse pose adjustment for 2d mapping," in IROS, Taipei, Taiwan, Oct. 2010 2010.
F. Lu and E. Milios, "Globally consistent range scan alignment for environment mapping," Autonomous robots, vol. 4, No. 4, pp. 333-349, 1997.
S. Kohlbrecher, J. Meyer, O. von Stryk, and U. Klingauf, "A flexible and scalable SLAM system with full 3d motion estimation," in Proc. IEEE International Symposium on Safety, Security and Rescue Robotics (SSRR). IEEE, Nov. 2011.
G. Grisetti, C. Stachniss, and W. Burgard, "Improving grid-based slam with rao-blackwellized particle filters by adaptive proposals and selective resampling," in Robotics and Automation, 2005. ICRA 2005. Proceedings of the 2005 IEEE International Conference on. IEEE, 2005, pp. 2432-2437.

(Continued)

*Primary Examiner* — Timothy A Mudrick
(74) *Attorney, Agent, or Firm* — Dority & Manning, P.A.

(57) ABSTRACT

Computer-implemented methods and systems for detecting loop closure in SLAM applications can include accessing one or more range measurement data scans that each provide a collection of consecutively observed spatial data obtained at a given location. A relative scan pose for each range measurement data scan can be determined. Frames from each of the one or more range measurement data scans then can be aligned to frames within one or more submaps based at least in part by the determined relative scan pose. An enhanced scan pose for each range measurement data scan and an enhanced submap pose for each submap can be periodically determined and used to identify one or more closed loops within the one or more submaps. An output indicative of the identified one or more closed loops can be provided, along with optionally generated floorplan maps and/or given location determinations.

20 Claims, 6 Drawing Sheets

(56) References Cited

OTHER PUBLICATIONS

G. D. Tipaldi, M. Braun, and K. O. Arras, "Flirt: Interest regions for 2d range data with applications to robot navigation," in Experimental Robotics. Springer, 2014, pp. 695-710.

J. Strom and E. Olson, "Occupancy grid msterization in large environments for teams of robots," in Intelligent Robots and Systems (IROS), 2011 IEEE/RSJ International Conference on. IEEE, 2011, pp. 4271-4276.

R. Kummerle, G. Grisetti, H. Strasdat, K. Konolige, and W. Burgard, "g2o: A general framework for graph optimization," in Robotics and Automation (ICRA), 2011 IEEE International Conference on. IEEE, 2011, pp. 3607-3613.

Carlone, R. Aragues, J. A. Castellanos, and B. Bona, "A fast and accurate approximation for planar pose graph optimization," The International Journal of Robotics Research, pp. 965-987, 2014.

S. Agarwal, K. Mierle, and Others, "Ceres solver," http://ceres-solver.org., accessed on Dec. 17, 2015, 2 pages.

P. Agarwal, G. D. Tipaldi, L. Spinello, C. Stachniss, and W. Burgard, "Robust map optimization using dynamic covariance scaling," in Robotics and Automation (ICRA), 2013 IEEE International Conference on. IEEE, 2013, pp. 62-69.

A. H. Land and A. G. Doig, "An automatic method of solving discrete programming problems," Econometrica, vol. 28, No. 3, pp. 497-520, 1960.

J. Clausen, "Branch and bound algorithms-principles and examples," Department of Computer Science, University of Copenhagen, pp. 1-30, 1999.

A. Howard and N. Roy, "The robotics data set repository (radish)," 2003. [Online]. Available: http://radish.sourceforge.net/, accessed on Dec. 17, 2015, 2 pages.

K. Konolige, J. Augenbraun, N. Donaldson, C. Fiebig, and P. Shah, "A low-cost laser distance sensor," in Robotics and Automation, 2008. ICRA 2008. IEEE International Conference on. IEEE, 2008, pp. 3002-3008.

R. Kummerle, B. Steder, C. Dornhege, M. Ruhnke, G. Grisetti, C. Stachniss, and A. Kleiner, "On measuring the accuracy of slam algorithms," Autonomous Robots, vol. 27, No. 4, pp. 387-407, 2009.

Leica Pegasus: Backpack, www.leica-geosystems.co m/en/Leica-PegasusBackpack_106730.htm, accessed on Oct. 6, 2015, 3 pages.

* cited by examiner

SYSTEMS AND METHODS OF DETECTING LOOP CLOSURE IN SIMULTANEOUS LOCALIZATION AND MAPPING (SLAM) APPLICATIONS

FIELD

The present disclosure relates generally to systems and methods of detecting loop closure, and more particularly to systems and methods of detecting loop closure to increase the accuracy of pose estimates and/or to provide solutions for global localization in simultaneous localization and mapping (SLAM) applications.

BACKGROUND

As-built floor plans are useful for a variety of applications. Manual surveys to collect this data for building management tasks typically combine computer-aided design (CAD) with laser tape measures. These methods can be slow and, by employing human preconceptions of buildings as collections of straight lines, do not always accurately describe the true nature of a modeled space.

Another known technology useful for generating as-built floor plans employs portable laser range-finders that gather LIDAR data coupled with simultaneous localization and mapping (SLAM) algorithms. Using SLAM, it is possible to swiftly and accurately survey buildings of sizes and complexities that would take orders of magnitude longer to survey manually. However, a need remains for increasing the accuracy of generated floor plans without significantly expanding the computational requirements of SLAM algorithms used in the process, especially for very large floor plans.

SUMMARY

Aspects and advantages of embodiments of the present disclosure will be set forth in part in the following description, or can be learned from the description, or can be learned through practice of the embodiments.

One example aspect of the present disclosure is directed to a computer-implemented method of detecting loop closure. The method can include accessing, by one or more computing devices, one or more range measurement data scans. Each range measurement data scan can include a collection of consecutively observed spatial data obtained at a given location. The method can also include determining, by the one or more computing devices, a relative scan pose for each range measurement data scan. The method can also include aligning, by the one or more computing devices, frames from each of the one or more range measurement data scans to frames within one or more submaps based at least in part by the determined relative scan pose. The method can also include periodically determining, by the one or more computing devices, an enhanced scan pose for each range measurement data scan and an enhanced submap pose for each submap. The method can also include identifying, by the one or more computing devices, one or more closed loops within the one or more submaps based at least in part on the periodically determined enhanced scan poses and enhanced submap poses. The method can also include providing, by the one or more computing devices, an output indicative of the identified one or more closed loops.

Other example aspects of the present disclosure are directed to systems, apparatus, tangible, non-transitory computer-readable media, user interfaces, memory devices, and electronic devices for detecting loop closure in simultaneous localization and mapping (SLAM) applications.

These and other features, aspects, and advantages of various embodiments will become better understood with reference to the following description and appended claims. The accompanying drawings, which are incorporated in and constitute a part of this specification, illustrate embodiments of the present disclosure and, together with the description, serve to explain the related principles.

BRIEF DESCRIPTION OF THE DRAWINGS

Detailed discussion of embodiments directed to one of ordinary skill in the art are set forth in the specification, which makes reference to the appended figures, in which.

DETAILED DESCRIPTION

Figure 1:
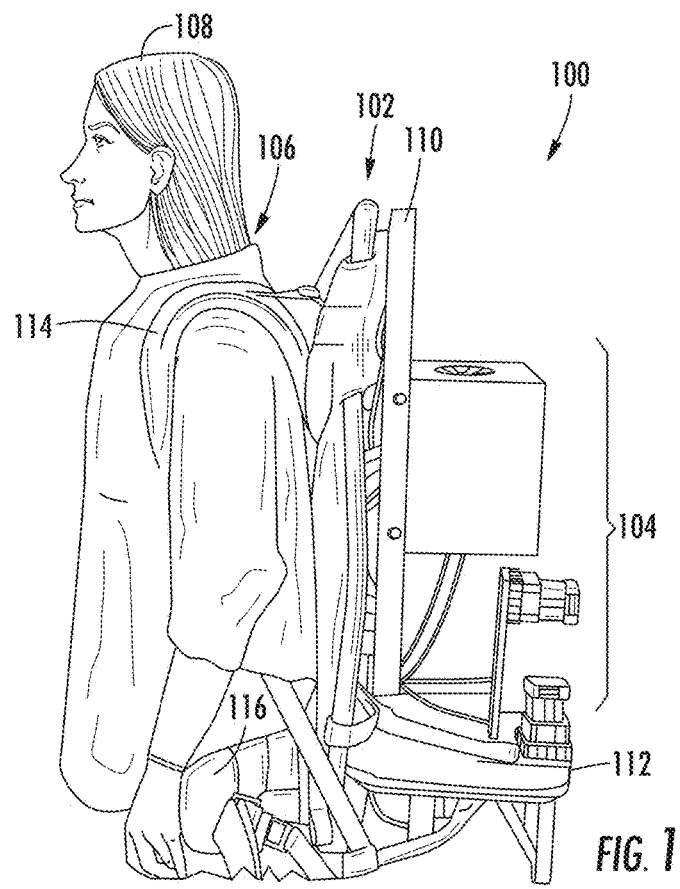
FIG. 1 provides an example perspective view of a mobile cartographer system according to example aspects of the present disclosure.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

In some embodiments, a user may not receive the benefits or be included in the techniques described herein unless they select a setting and/or install one or more applications, drivers, etc. In some embodiments, a user may be provided with controls allowing the user to make an election as to both if and when systems, programs or features described herein may enable collection of user information (e.g., current location of a user) and if the user is sent content or communications from a server. In addition, certain data may be treated in one or more ways before it is stored or used, so that personally identifiable information is removed. For example, a user's identity may be treated so that no personally identifiable information can be determined for the user. Thus, the user may have control over what information is collected about the user, how that information is used, and what information is provided to the user.

Example aspects of the present disclosure are directed to systems and methods of detecting loop closure. Loop closure detection is an important aspect for enhancing the robustness of simultaneous localization and mapping (SLAM) algorithms for efficiently generating as-built floor plans from scanned local areas. In general, loop closure detection involves identifying when a data scanner (e.g., laser range finders or other range measurement devices) has returned to a past location after capturing data for new locations.

More accurate loop closure detection techniques can help increase the precision of actual pose estimates used in SLAM algorithms, thus improving overall SLAM performance. Recognizing previously mapped locations can also be advantageous in related applications, such as but not limited to providing solutions for global localization, or determining a current location. In addition to more accurate solutions, technology is needed to detect loop closure in a manner that reduces the computational requirements of computing loop closure constraints from laser range data. Loop closure detection according to example aspects of the present disclosure can improve accuracy and computational efficiency while also accommodating the mapping of relatively large floor plans while providing fully-optimized mapping results in real time.

Some embodiments according to example aspects of the present disclosure can access one or more range measurement data scans that respectively include a collection of consecutively observed spatial data at a given location. Range measurement data scans can be obtained by laser range finders or other range measurement devices, optionally coupled with an inertial measurement unit (IMU) or other device configured to measure angular velocity while measurements are obtained. In some examples, the spatial data within each range measurement data scan can include a two-dimensional translation parameter and a rotation parameter. The rotation parameters of the scan can be determined using the IMU or other device configured to measure angular velocity while the consecutively observed spatial data is obtained.

Scan matching aspects of the disclosed systems and methods can include determining a relative scan pose for each range measurement data scan and aligning scan frames to submap frames using the determined relative scan poses. In some examples, determining a relative scan pose corresponds to optimizing or otherwise enhancing the relative scan pose by solving a non-linear least squares problem. Frames within each of the range measurement data scans can be aligned to frames within one or more submaps based at least in part by the determined relative scan pose.

In more particular examples, scan to submap matching can utilize a probability grid based approach. In such instances, a probability grid of discrete grid points can be generated. A probability value can be calculated for selected grid points, wherein the probability value corresponds to a probability that the selected grid point is obstructed in a range measurement data scan. Grid points can be identified as hits or misses based on the calculated probability values, which are then used in part to align frames in each of the range measurement data scans to frames within a submap. When probability grids are used in scan to submap matching, relative scan poses can be enhanced by determining a scan pose for each range measurement data scan that maximizes the probability grid over all grid points.

Loop closure optimization aspects of the disclosed embodiments can involve periodically determining an enhanced scan pose for each range measurement data scan and an enhanced submap pose for each submap. This periodic optimization can be performed at least once within a period of no more than about 5 seconds, 10 seconds, or other predetermined amount of time. One or more constraints can be identified as part of determining enhanced scan poses and enhanced submap poses. In some examples, the constraints can include relative scan poses and covariance matrices associated with the relative scan poses. The constraints then can be used to solve a non-linear least squares optimization formula. A branch and bound algorithm can be utilized to solve the non-linear least squares optimization formula, with optional implementation of a depth-first search (DFS) approach to node selection in the branch and bound algorithm. Solutions to the non-linear least squares optimization formula can ultimately be used to identify one or more closed loops (e.g., a loop of obtained spatial data wherein a determination is made that the range measurement data scan has returned to a previously recorded location).

Outputs indicative of identified closed loops can be provided in audio form, visual form or data form. In some examples, the given location associated with each range measurement data scan can be determined based at least in part on the enhanced scan poses, enhanced submap poses and/or identified closed loops and provided as a system output. In other examples, a floorplan map of selected submaps can be generated based at least in part on the enhanced scan poses, enhanced submap poses and/or identified closed loops and provided for display.

According to an example embodiment, a mobile cartographer system including one or more laser scanners and optional inertial measurement unit (IMU) is used to gather spatial LIDAR data including one or more range measurement data scans. The data scans are positioned within submaps of a local area through a process of pose optimization using probability grid techniques and alignment of scan frames to submap frames. Loop closure optimization can then utilize periodic optimization or enhancement of scan poses and submap poses using a branch and bound algorithm in order to identify closed loops within the obtained spatial data. Detection of closed loops can be used to help improve the accuracy of generated floorplan maps and/or to identify given locations of the obtained spatial data. The detected closed loops, generated floorplan maps and/or global localization identifications can be provided as real-time outputs to a user.

Referring now to the drawings, exemplary embodiments of the present disclosure will now be discussed in detail. FIG. 1 provides an example overview of a mobile cartographer system 100 according to example aspects of the present disclosure. Mobile cartographer system 100 generally includes a mobile platform 102, a plurality of hardware components 104 and one or more attachment features 106 for securing the mobile platform 102 and hardware components 104 to a user 108. In some examples, mobile platform 102 is designed in a backpack configuration and includes a vertical frame element 110 configured to align adjacent to the back of a user 108 and a horizontal extension element 112 extending generally perpendicular from the vertical frame element 110. Hardware components 104 can be selectively mounted to a surface of the vertical frame element 110 and/or surfaces of the horizontal extension element 112. Attachment features 106 can be secured to portions of the mobile platform 102 in order to securely position the mobile cartographer system 100 relative to user 108. For example, attachment features can include dual shoulder straps 114 for secure positioning over the shoulders of user 108 and/or waist strap 116 for secure attachment around the waist of user 108. Shoulder straps 114 and/or waist strap 116 can include adjustable connectors such that the straps can be lengthened or shortened as needed to accommodate users of different heights and sizes. Shoulder straps 114 and/or waist straps 116 also can include a variety of fasteners to enhance securement of the mobile cartographer system 100 relative to user 108 once properly positioned.

Figure 2:
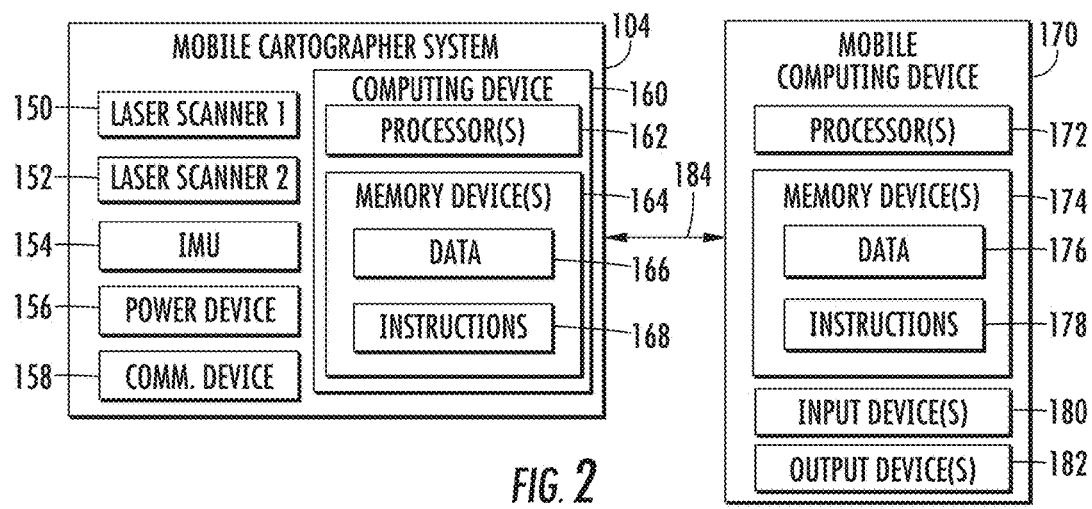
FIG. 2 depicts an example overview of system components for use in a mobile cartographer system and associated mobile device according to example aspects of the present disclosure.

FIG. 2 depicts additional aspects of the hardware components 104 within mobile cartographer system 100. In some examples, mobile cartographer system hardware components 104 can include a first laser scanner 150, a second laser scanner 152, an inertial measurement unit 154, a power device 156, a communication device 158 and a computing device 160.

First laser scanner 150 and second laser scanner 152 can include lasers configured to emit laser beams that are steered in different directions in order to obtain LIDAR distance measurements at every pointing direction. Laser scanners 150, 152 can also be configured as laser rangefinders, and can be configured to obtain either two-dimensional (2D) or three-dimensional translation (3D) parameters or other distance measurements. Although two laser scanners 150, 152 are depicted in FIG. 2, other example embodiments can utilize a single laser scanner or greater than two laser scanners. In still other examples, alternative range-finding or remote sensing hardware such as SONAR and/or RADAR based systems, depth cameras, and/or systems employing structured light or stereo vision can be used to obtain range measurement data scans.

Referring still to FIG. 2, inertial measurement unit (IMU) 154 can be optionally provided in order to measure and record linear and/or angular motion parameters. For example, IMU 154 can be configured to measure rotational parameters such as but not limited to the angular velocity while consecutively observed spatial data is obtained by first and second laser scanners 150, 152. In some examples, IMU 154 can include a plurality of accelerometers, a plurality of gyroscopes, and a plurality of magnetometers that combine to measure linear and angular motion parameters in multiple dimensions. In some examples that include cartographer system components on a stable platform (e.g., a wheeled robot on generally even terrain), IMU 154 is optional and not required to obtain parameters related to scan data.

Power device 156 can include any type of energy storage device such as a battery or capacitive device, which optionally can be rechargeable. Communication device 158 can be provided to interface the mobile cartographer system hardware components 104 to a mobile computing device 170 and/or a remote server computing device (not illustrated). Computing device 160 within the mobile cartographer system hardware components 104 and mobile computing device 170 can be any suitable type of computing device, such as a general purpose computer, special purpose computer, navigation system (e.g. an automobile navigation system), laptop, desktop, mobile device, smartphone, tablet, wearable computing device, a display with one or more processors, or other suitable computing device.

The computing devices 160 and/or 170 of FIG. 2 can respectively include one or more processor(s) 162, 172 and one or more memory devices 164, 174. The one or more processor(s) 162, 172 can include any suitable processing device, such as a microprocessor, microcontroller, integrated circuit, logic device, one or more central processing units (CPUs), graphics processing units (GPUs) dedicated to efficiently rendering images or performing other specialized calculations, and/or other processing devices. The one or more memory devices 164, 174 can include one or more computer-readable media, including, but not limited to, non-transitory computer-readable media, RAM, ROM, hard drives, flash drives, or other memory devices. In some examples, memory devices 164, 174 can correspond to coordinated databases that are split over multiple locations.

The one or more memory devices 164, 174 can store information accessible by the one or more processors 162, 172, including instructions (e.g, instructions 168, 178) that can be executed by the one or more processors 162, 172. For instance, memory device 162 associated with mobile cartographer system computing device 160 can store instructions 168 for implementing a SLAM algorithm including a loop closure detection application configured to perform various functions disclosed herein. The memory device 174 associated with mobile computing device 170 can store instructions for implementing a browser or application that allows a user to selectively interact with input and output features of a SLAM algorithm, floorplan generating application or other mapping applications.

The one or more memory devices 164, 174 also can include data (e.g., data 166, 176) that can be retrieved, manipulated, created, or stored by the one or more processors 162, 172. The data 166 stored at mobile cartographer system computing device 160 can include, for instance, translational parameter data obtained from laser scanners 150, 152 and/or rotational parameter data obtained from IMU 154. Data 176 stored at mobile computing device 170 can include user inputs received from an input device 180 and imaging data depicting generated floor plan outputs provided for display via an output device 182. Input device 180 can include devices such as a touch screen, touch pad, data entry keys, and/or a microphone suitable for voice recognition. Output device 182 can include audio or visual outputs such as speakers or displays for providing various user interfaces in accordance with the disclosed closed loop detection and/or cartographer systems, such as but not limited to generated floorplan maps and/or location determinations for respective data scans.

Mobile cartographer system computing device 160 and/or mobile computing device 170 can communicate with one another over a network 184. In such instances, the mobile cartographer system computing device 160 and/or mobile computing device 170 can also respectively include a network interface (e.g., communication device 158) used to communicate with one another over the network 184. The network interface(s) can include any suitable components for interfacing with one more networks, including for example, transmitters, receivers, ports, controllers, antennas, or other suitable components. The network 184 can be any type of communications network, such as a local area network (e.g. intranet), wide area network (e.g. Internet), cellular network, or some combination thereof. The network 184 can also include a direct connection between mobile cartographer system computing device 160 and mobile computing device 170. In general, communication among computing devices can be carried via network interface using any type of wired and/or wireless connection, using a variety of communication protocols (e.g. TCP/IP, HTTP, SMTP, FTP), encodings or formats (e.g. HTML, XML), and/or protection schemes (e.g. VPN, secure HTTP, SSL).

The computer-executable algorithms described herein can be implemented in hardware, application specific circuits, firmware and/or software controlling a general purpose processor. In one embodiment, the algorithms are program code files stored on the storage device, loaded into one or more memory devices and executed by one or more processors or can be provided from computer program products, for example computer executable instructions, that are stored in a tangible computer-readable storage medium such as RAM, flash drive, hard disk, or optical or magnetic media. When software is used, any suitable programming language or platform can be used to implement the algorithm.

Figure 3:
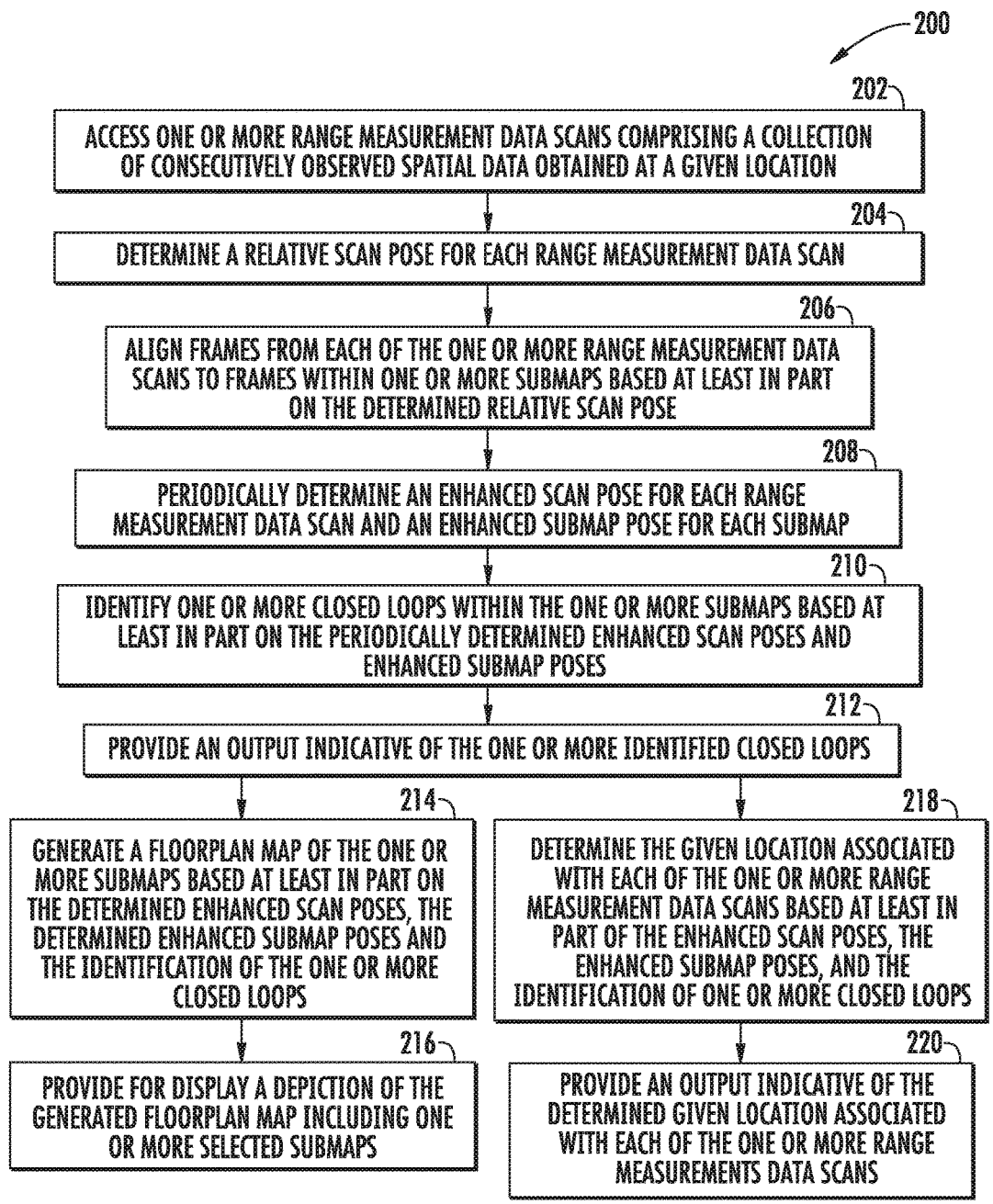
FIG. 3 provides a flow chart of an example method of detecting loop closure according to example aspects of the present disclosure.

Referring now to FIG. 3, an example loop closure detection method (200) according to example aspects of the present disclosure includes accessing (202) one or more range measurement data scans. Range measurement data scans accessed at (202) can be obtained from a mobile cartographer system 100 as depicted in FIGS. 1 and 2 that collects range measurement data scans while an operator/user walks through a defined space such as a building interior or the like. The range measurement data scans accessed at (202) can include a collection of consecutively observed spatial data obtained at multiple given locations throughout the indoor environment.

Loop closure detection method (200) can generally combine a local pose enhancement at (204) and a global pose enhancement at (208) to improve pose estimates and overall accuracy of SLAM floorplan generation at (214), (216) and/or global localization at (218), (220). Both pose enhancement steps (204) and (208) seek to determine an enhanced pose, $\xi=(\xi_x,\xi_y,\xi_\theta)$ consisting of a (x,y) translation and a rotation $\xi_\theta$, of LIDAR observations accessed at (202), which are further referred to as range measurement data scans, or scans. When data accessed at (202) is obtained via a mobile cartographer system 100 that can have limited stability in certain instances, scans accessed at (202) can include data from an IMU 154 that estimates the orientation of gravity for projecting scans from a horizontally mounted laser scanner into a two-dimensional world.

The representation of scan data accessed at (202) can be described relative to scans and submaps. Each consecutive scan obtained and accessed at (202) can be matched against a small chunk of the world, called a submap M, using a non-linear optimization that aligns the scan with the submap. This process is further referred to as scan matching, and can generally include determining (204) a relative scan pose for each range measurement data scan. In some examples, scan matching can accumulate error over time that can be removed using features of the presently disclosed embodiments, particularly via the enhanced scan and submap pose determinations at (208).

Submap construction is the iterative process of repeatedly aligning at (206) scan and submap coordinate frames, further referred to as frames. With the origin of the scan at $0 \in \mathbb{R}^2$, the information about scan points can be represented as $H=\{h_k\}_{k=1,\ldots,K}$, $h_k \in \mathbb{R}^2$. The pose $\xi$ of the scan frame in the submap frame can be represented as the transformation $T_\xi$, which rigidly transforms scan points from the scan frame into the submap frame, defined as $$T_{\xi}p = \underbrace{\begin{pmatrix} \cos\xi_\theta & -\sin\xi_\theta \\ \sin\xi_\theta & \cos\xi_\theta \end{pmatrix}}_{R_\xi}p + \underbrace{\begin{pmatrix} \xi_x \\ \xi_y \end{pmatrix}}_{t_\xi}. \quad (1)$$

Figure 4:
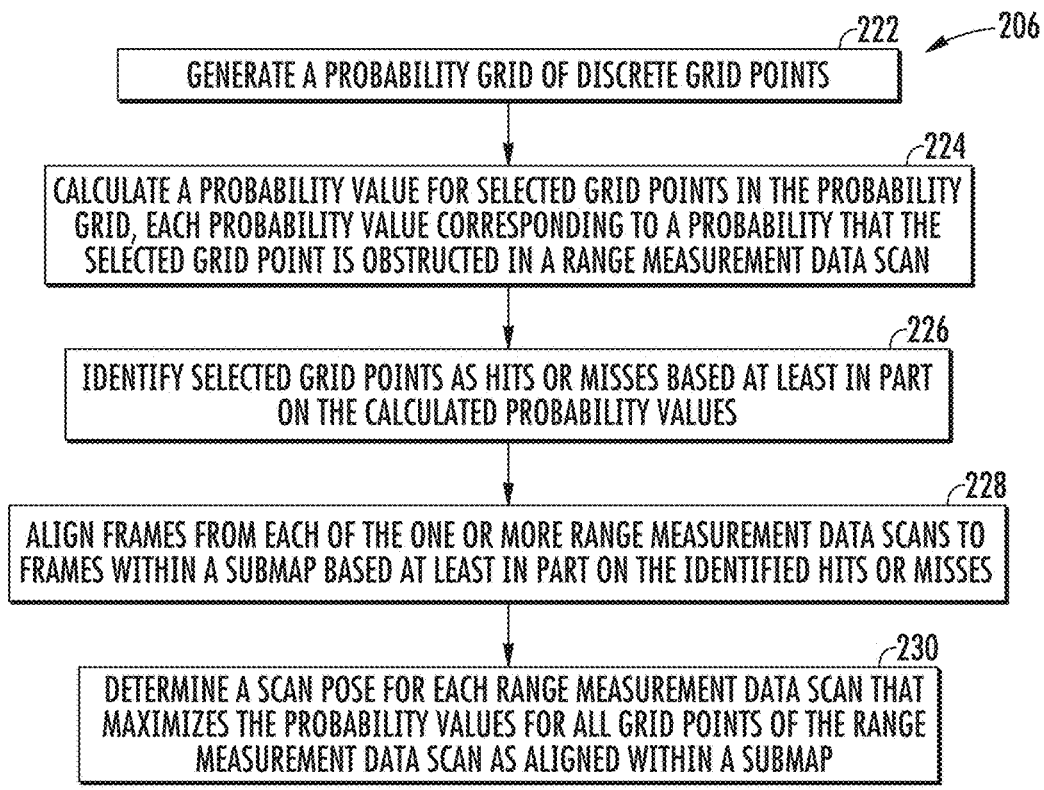
FIG. 4 provides a flow chart of an example method of performing scan to submap matching according to example aspects of the present disclosure.

In more particular examples, scan to submap matching at (206) in which a few consecutive scans are used to build a submap can utilize a probability grid based approach such as depicted in FIG. 4. In such instances, a probability grid of discrete grid points can be generated at (222). For example, submaps can take the form of probability grids $M: r\mathbb{Z} \times r\mathbb{Z} \to [p_{min},p_{max}]$ which map from discrete grid points at a given resolution r, for example 5 cm, to values. A probability value can be calculated at (224) for some or all grid points, where the calculated probability value corresponds to a probability that the selected grid point is obstructed in a range measurement data scan.

Grid points can be identified as hits or misses at (226) based on the probability values calculated at (224), which then can be used in part to align frames at (228) in each of the range measurement scans to frames within a submap. For each grid point, a corresponding pixel can be structured to consist of all points that are closest to that grid point. Whenever a scan is to be inserted into the probability grid, a set of grid points for hits and a disjoint set for misses can be computed at (226). For every hit, the closest grid point can be inserted into the hit set. For every miss, the grid point associated with each pixel that intersects one of the rays between the scan origin and each scan point can be inserted, excluding grid points which are already in the hit set. Every formerly unobserved grid point can be assigned a probability $p_{hit}$ or $p_{miss}$ if it is in one of these sets. If the grid point x has already been observed, the odds for hits and misses can be updated as $$\text{odds}(p) = \frac{p}{1-p}, \quad (2)$$

$$M_{new}(x) = \text{clamp}(\text{odds}^{-1}(\text{odds}(M_{old}(x)) \cdot \text{odds}(p_{hit}))) \quad (3)$$

Figure 6:
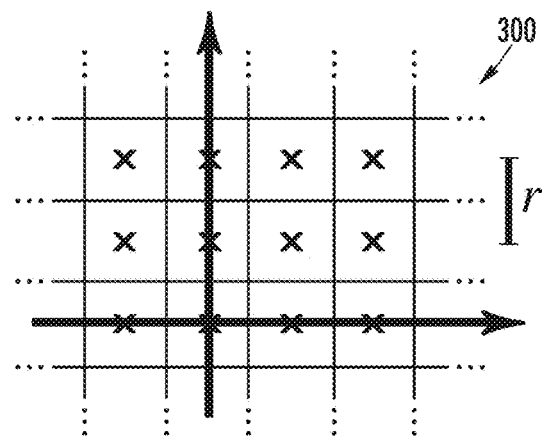
FIG. 6 provides an example schematic of grid points and associated pixels used when inserting a scan into a probability grid according to example aspects of the present disclosure.
Figure 7:
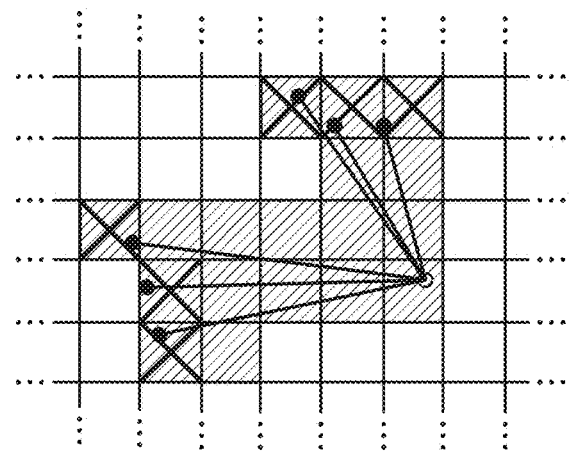
FIG. 7 provides an example schematic of a scan and pixels associated with hits and misses according to example aspects of the present disclosure.

An example probability grid 300 of grid points and associated pixels having resolution (r) is depicted in FIG. 6, while FIG. 7 illustrates a scan and pixels associated with hits (shaded and crossed out) and misses (shaded only).

The process set forth in FIG. 2 of discretely defining range measurement data scans as a probability grid of pixels can be helpful when comparing scan data to a submap during the alignment at (206), because the true position of obstacles reflected by a laser scanner can be estimated by interpolating values between neighboring pixels. In instances when two neighboring pixels are ~50% likely to contain the obstacle, a determination can be made that the obstacle is located somewhere in between the two neighboring pixels.

Prior to inserting a scan into a submap in the alignment at (206), a relative scan pose $\xi$ can be optimized or otherwise enhanced at (204) relative to the current local submap, for example using a scan matcher based on non-linear least squares. The scan matcher can find a scan pose for each scan accessed at (202) that maximizes the probability values at the scan points in the submap at (230). This step can involve solving a non-linear least squares problem (CS) as follows $$\operatorname*{argmin}_{\xi} \sum_{k=1}^{K} (1 - M_{smooth}(T_\xi h_k))^2 \quad \text{(CS)}$$

where $T_\xi$ transforms $h_k$ from the scan frame to the submap frame according to the scan pose. The function $M_{smooth}$: $\mathbb{R}^2 \to \mathbb{R}$ is a smooth version of the probability values in the local submap. In some examples, bicubic interpolation can be used. As a result, values outside the interval [0,1] can occur but are considered harmless.

Mathematical optimization of the smooth function defined as (CS) can often give better precision than the resolution of the grid. Since this is a local optimization, good initial estimates are helpful. An IMU capable of measuring angular velocities can be used to estimate the rotational component θ of the pose between scan matches. A higher frequency of scan matches or pixel-accurate scan matching approach, although more computationally intesnsive, can be used in the absence of an IMU. Once enhanced relative scan poses are determined at (204) using the (CS) equation, frames within each of the range measurement data scans can be aligned at (206) to frames within one or more submaps based at least in part by the determined relative scan pose.

As scans are only matched against a submap containing a few recent scans, the relative scan pose determination at (204) and submap construction at (206) has the potential to slowly accumulate errors. For only a few dozen consecutive scans, the accumulated error can be small. However, larger spaces can be handled by creating many small submaps in which error accumulation can increase. In order to reduce the potential accumulation of errors, optimized or otherwise enhanced poses can be periodically determined at (208) for all scans and submaps or for a selected portion of scans and submaps. The relative poses determined at (204) where scans are inserted are stored in memory for use in the loop closing optimization of (208) and (210). In addition to these relative poses, all other pairs consisting of a scan and a submap are considered for loop closing once the submap no longer changes. A scan matcher is run in the background and if a good match is found, the corresponding relative pose is added to the optimization problem. Enhanced scan poses and submap poses identified at (210) can ultimately be used to identify at (212) one or more closed loops (e.g., a loop of obtained spatial data wherein a determination is made that the range measurement data scan has returned to a previously recorded location).

Figure 5:
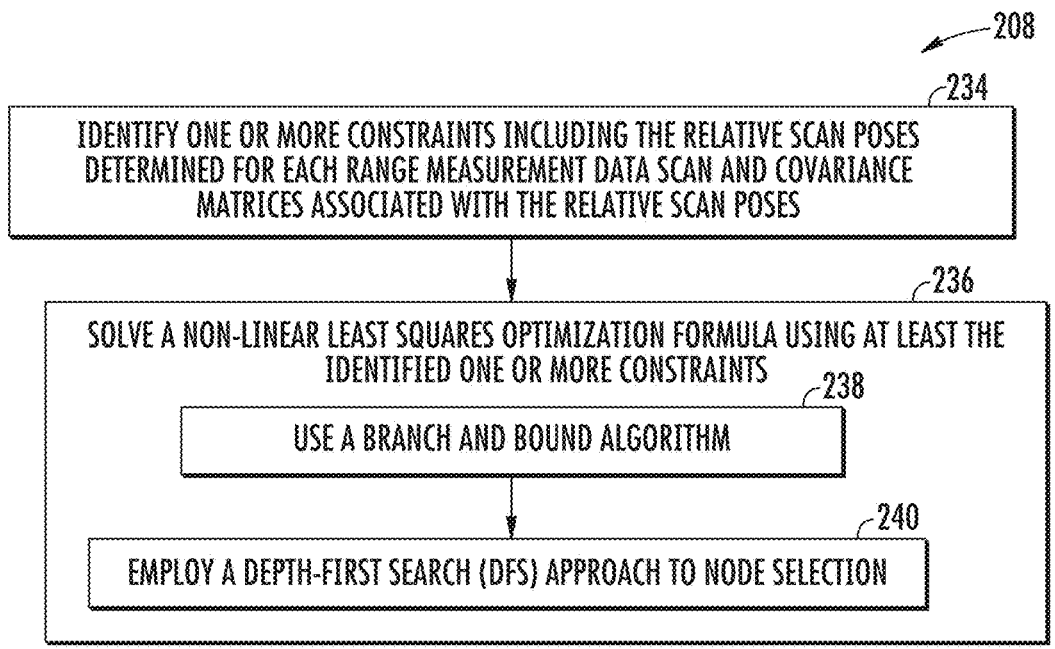
FIG. 5 provides a flow chart of an example method of pose enhancement according to example aspects of the present disclosure.

Referring now to FIG. 5, additional aspects of loop closure optimization at (208) are depicted. Loop closure optimization at (208), like scan matching at (204), also can be formulated as a non-linear least squares problem which allows easily adding residuals to take additional data into account. This periodic optimization at (208) can be performed at least once within an interval of no more than about 5 seconds, 10 seconds, or other predetermined amount of time. Once every interval, a solution to the following (SPA) equation is calculated as:

$$\underset{\Xi^m, \Xi^s}{\operatorname{argmin}} \frac{1}{2} \sum_{ij} \rho\left(E^2\left(\xi_i^m, \xi_j^s; \sum_{ij}, \xi_{ij}\right)\right) \tag{SPA}$$

where the submap poses $\Xi^m = \{\xi_i^m\}_{i=1,\ldots,m}$ and the scan poses $\Xi^s = \{\xi_j^s\}_{j=1,\ldots,n}$ in the world are optimized given some constraints. In some examples, one or more constraints can be identified at (234) and can include relative scan poses $\xi_{ij}$ identified for each relative scan and covariance matrices $\Sigma_{ij}$ associated with the relative scan poses. The constraints then can be used at (236) to solve a non-linear least squares optimization formula (SPA). For a pair of submap i and scan j, the pose $\xi_{ij}$ describes where in the submap coordinate frame the scan was matched. The residual E for such a constraint is computed by $$E^2\left(\xi_i^m, \xi_j^s; \sum_{ij}, \xi_{ij}\right) = e(\xi_i^m, \xi_j^s; \xi_{ij})^T \sum_{ij}^{-1} e(\xi_i^m, \xi_j^s; \xi_{ij}), \tag{4}$$

$$e(\xi_i^m, \xi_j^s; \xi_{ij}) = \xi_{ij} - \begin{pmatrix} R_{\xi_i^m}^{-1}(t_{\xi_i^m} - t_{\xi_j^s}) \\ \xi_{i;\theta}^m - \xi_{j;\theta}^s \end{pmatrix}. \tag{5}$$

A loss function ρ, for example Huber loss, can be used to reduce the influence of outliers which can appear in (SPA) when scan matching adds incorrect constraints to the optimization problem. For example, this may happen in locally symmetric environments, such as office cubicles.

In some examples, a branch and bound algorithm can be utilized at (238) to solve the non-linear least squares optimization formula (SPA). In accordance with a branch and bound algorithm, an optimal or otherwise enhanced pixel-accurate match can be expressed as:

$$\xi^* = \underset{\xi \in \mathcal{W}}{\operatorname{argmax}} \sum_{k=1}^{K} M_{nearest}(T_\xi h_k), \tag{BBS}$$

where $\mathcal{W}$ is the search window and $M_{nearest}$ is M extended to all of $\mathbb{R}^2$ by rounding its arguments to the nearest grid point first, that is extending the value of a grid points to the corresponding pixel. The quality of the match can be improved further using (CS). Efficiency can be improved by carefully choosing step sizes. In some examples, an angular step size $\delta_\theta$ can be chosen so that scan points at the maximum range $d_{max}$ do not move more than r, the width of one pixel. Using the law of cosines, derivations follow as $$d_{max} = \max_{k=1,\ldots,K} \|h_k\|, \tag{6}$$

$$\delta_\theta = \arccos\left(1 - \frac{r^2}{2d_{max}^2}\right). \tag{7}$$

An integral number of steps can be determined covering given linear and angular search window sizes, e.g., $W_x = W_y = 7$ m and $W_\theta = 30°$, $$w_x = \left\lceil \frac{W_x}{r} \right\rceil, \quad w_y = \left\lceil \frac{W_y}{r} \right\rceil, \quad w_\theta = \left\lceil \frac{W_\theta}{\delta_\theta} \right\rceil. \tag{8}$$

This leads to a finite set $\mathcal{W}$ forming a search window around an estimate $\xi_0$ placed in its center, $$\mathcal{W} = \{-w_x, \ldots, w_x\} \times \{-w_y, \ldots, w_y\} \times \{-w_\theta, \ldots, w_\theta\}, \tag{9}$$

$$\mathcal{W} = \{\xi_0 + (r j_x, r j_y, \delta_\theta j_\theta) : (j_x, j_y, j_\theta) \in \overline{\mathcal{W}}\}. \tag{10}$$

For smaller search window sizes, an example naïve algorithm to find $\xi^*$ can be formulated using Algorithm 1 below.

---
Algorithm 1 Naive algorithm for (BBS)
--- best_score ← −∞
for $j_x$ = −$w_x$ to $w_x$ do
  for $j_y$ = −$w_y$ to $w_y$ do
    for $j_\theta$ = −$w_\theta$ to $w_\theta$ do
      score ← $\sum_{k=1}^{K} M_{nearest}(T_{\xi_0 + (rj_\alpha, rj_u, \delta_\theta j_\theta)} h_k)$
      if score > best_score then
        match ← $\xi_0 + (rj_x, rj_y, \delta_\theta j_\theta)$
        best_score ← score
      end if
    end for
  end for
end for
return best_score and match when set.

---

In other examples, a branch and bound approach to efficiently compute $\xi^*$ over larger search windows uses example Algorithm 2 below. In general, Algorithm 2 represents subsets of possibilities as nodes in a tree where the root node represents all possible solutions, $\mathcal{W}$ in the present case. The children of each node can form a partition of their parent, so that they together represent the same set of possibilities. The leaf nodes are singletons; each represents a single feasible solution. In some examples, Algorithm 2 can provide the same solution as Algorithm 1 when the score(c) of inner nodes c is an upper bound on the score of its elements. In that case, whenever a node is bounded, a solution better than the best known solution so far does not exist in this subtree.

---
Algorithm 2 Generic branch and bound
--- best_score ← −∞
C ← $C_0$
while C ≠ ∅ do
  Select a node c ∈ C and remove it from the set
  if c is a leaf node then
    if score(c) > best_score then
      solution ← n
      best_score ← score(c)
    end if
  else
    if score(c) > best_score then
      Branch: Split c into nodes $C_c$.
      C ← C ∪ $C_c$
    else
      Bound.
    end if
  end if
end while
return best_score and solution when set.

---

More particular examples of a branch and bound algorithm used at (238) can include specific methods of node selection, branching, and computation of upper bounds.

In one particular implementation of node selection within a branch and bound algorithm, a depth-first search (DFS) approach to node selection is employed at (240). In some examples, the efficiency of a DFS algorithm is improved when a large part of the tree is pruned. This can be dependent on having a good upper bound and a good current solution. The latter part is helped by DFS, which quickly evaluates many leaf nodes. Since poor matches can be undesirable as loop closing constraints, a score threshold can also be introduced so that optimal solutions are not determined when the score threshold is not met. In many examples, the threshold will not be surpassed, thus reducing the importance of node selection or finding an initial heuristic solution. Regarding the order in which the children are visited during the DFS algorithm, an upper bound can be computed on the score for each child, visiting the most promising child node with the largest bound first. An example algorithm for implementing this approach is provided in Algorithm 3.

---
Algorithm 3 DF'S branch and bound scan matcher for BBS
--- best_score ← score_threshold
Compute and memorize a score for each element in $C_0$.
Initialize a stack C with $C_0$ sorted by score, the maximum score at the top
while C is not empty do
  Pop c from the stack C
  if score(c) > best_score then
    if c is a leaf node then
      match ← $\xi_c$
      best_score ← score(c)
    else
      Branch: Split c into nodes $C_c$.
      Compute and memorize a score for each statement in $C_c$.
      Push $C_c$ onto the stack C, sorted by score, the maximum score last.
    end if
  end if
end while
return best_score and match when set.

---

In one particular implementation of branching within a branch and bound algorithm, a branching rule can be implemented that describes each node in the tree by a tuple of integers $c = (c_x, c_y, c_\theta, c_h) \in \mathbb{Z}^4$. Nodes at height $c_h$ combine up to $2^{c_h} \times 2^{c_h}$ possible translations but represent a specific rotation:

$$\overline{\mathcal{W}}_c = \left( \left\{ (j_x, j_y) \in \mathbb{Z}^2 : \begin{array}{l} c_x \leq j_x < c_x + 2^{ch} \\ c_y \leq j_y < c_y + 2^{ch} \end{array} \right\} \times \{c_\theta\} \right), \quad (11)$$

$$\mathcal{W}_c = \overline{\mathcal{W}}_c \cap \mathcal{W}. \quad (12)$$

Leaf nodes have height $c_h = 0$, and correspond to feasible solutions $\mathcal{W} \ni \xi_c = \xi_0 + (rc_x, rc_y, \delta_\theta c_\theta)$. In example Algorithm 3, the root node, encompassing all feasible solutions, does not explicitly appear and branches into a set of initial nodes $\exists_0$ at a fixed height $h_0$ covering the search window $\mathcal{W}_{0,x} = \{-w_x + 2^{h_0} j_x : j_x \in \mathbb{Z}, 0 \leq 2^{h_0} j_x \leq 2w_x\}$, $\mathcal{W}_{0,y} = \{-w_y + 2^{h_0} j_y : j_y \in \mathbb{Z}, 0 \leq 2^{h_0} j_y \leq 2w_y\}$, $\mathcal{W}_{0,\theta} = \{j_\theta \in \mathbb{Z} : -w_\theta \leq j_\theta \leq w_\theta\}$, $C_0 = \mathcal{W}_{0,x} \times \mathcal{W}_{0,y} \times \mathcal{W}_{0,\theta} \times \{h_0\}$.

At a given node c with $c_h > 1$, the analysis branches into up to four children of height $c_h - 1$ $$C_c = \Big( \{c_x, c_x + 2^{ch-1}\} \times \{c_y, c_y + 2^{ch-1}\} \times c_\theta \Big) \cap \mathcal{W}$$
$$\times \{c_h - 1\}. \quad (14)$$

In one particular implementation of computing upper bounds within a branch and bound algorithm, various approaches have been identified for efficiently computing upper bounds at inner nodes, both in terms of computational effort and in the quality of the bound. A scoring formula defined can be defined at (15) as $$\text{score}(c) = \sum_{k=1}^{K} \max_{j \in \overline{W}_c} M_{nearest}(T_{\xi_j} h_k) \quad (15)$$

$$\geq \sum_{k=1}^{K} \max_{j \in \overline{W}'_c} M_{nearest}(T_{\xi_j} h_k)$$

$$\geq \max_{j \in \overline{W}_c} \sum_{k=1}^{K} M_{nearest}(T_{\xi_j} h_k).$$

Figure 8:
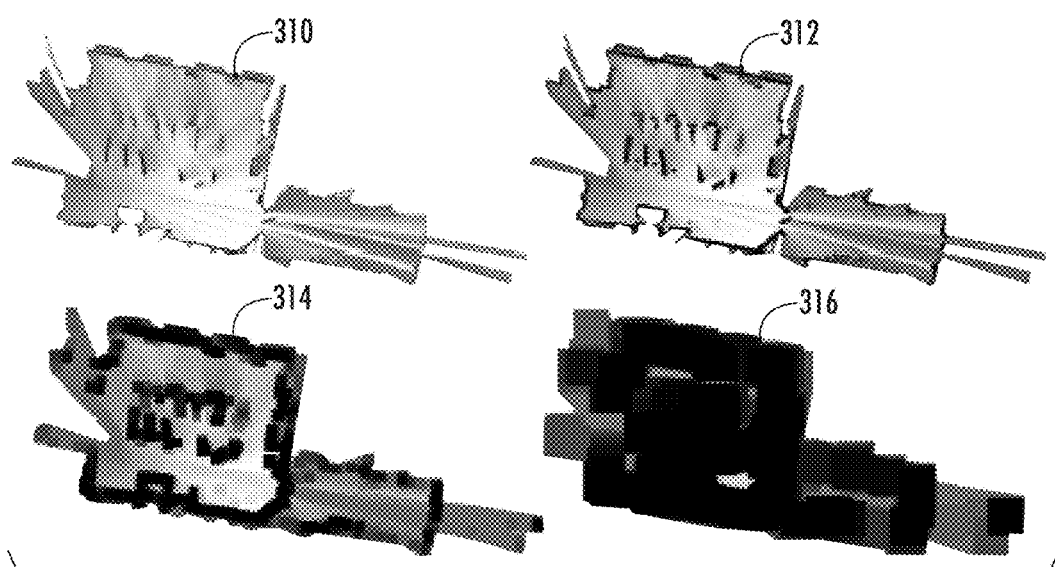
FIG. 8 provides an example overview of precomputed grids of varied sizes according to example aspects of the present disclosure.

To be able to compute the maximum in (15) efficiently, precomputed grids $M_{precomp}^{c_h}$ can be used. Precomputing one grid per possible height $c_h$ allows us to compute the score with effort linear in the number of scan points. This approach can also involve computation of the maximum over $\overline{W}_{c_c}$ which can be larger than $W_{c_c}$ near the boundary of a given search space, $$\text{score}(c) = \sum_{k=1}^{K} M_{precomp}^{c_h}(T_{\xi_c} h_k), \quad (16)$$

$$M_{precomp}^{h}(x, y) = \max_{\substack{x' \in [x, x+r(2^h-1)] \\ y' \in [y, y+r(2^h-1)]}} M_{nearest}(x', y') \quad (17)$$

with $\xi_c$ as before for the leaf nodes. Note that $M_{precomp}^{c_h}$ has the same pixel structure as $M_{nearest}$, but in each pixel storing the maximum of the values of the $2^h \times 2^h$ box of pixels beginning there. An example of such precomputed grids is depicted in FIG. 8, showing a precomputed grid 310 having a pixel size of 1, a precomputed grid 312 having a pixel size of 4, a precomputed grid 314 having a pixel size of 16 and a precomputed grid 316 having a pixel size of 64.

To keep the computational effort for constructing the precomputed grids low, a decision can be made to wait until a probability grid will receive no further updates. Then a collection of precomputed grids can be computed to start matching against. For each precomputed grid, the maximum of a $2^h$ pixel wide row starting at each pixel can be computed. Using this intermediate result, the next precomputed grid then can be constructed. The maximum of a changing collection of values can be kept up-to-date in amortized $\mathcal{O}(1)$ if values are removed in the order in which they have been added. Successive maxima can be kept in a deque that can be defined recursively as containing the maximum of all values currently in the collection followed by the list of successive maxima of all values after the first occurrence of the maximum. For an empty collection of values, this list is empty. Using this approach, the precomputed grids can be computed in $\mathcal{O}(n)$ where n is the number of pixels in each precomputed grids. An alternative way to compute upper bounds can include computing lower resolution probability grids, for example successively halving the resolution.

Figure 9:
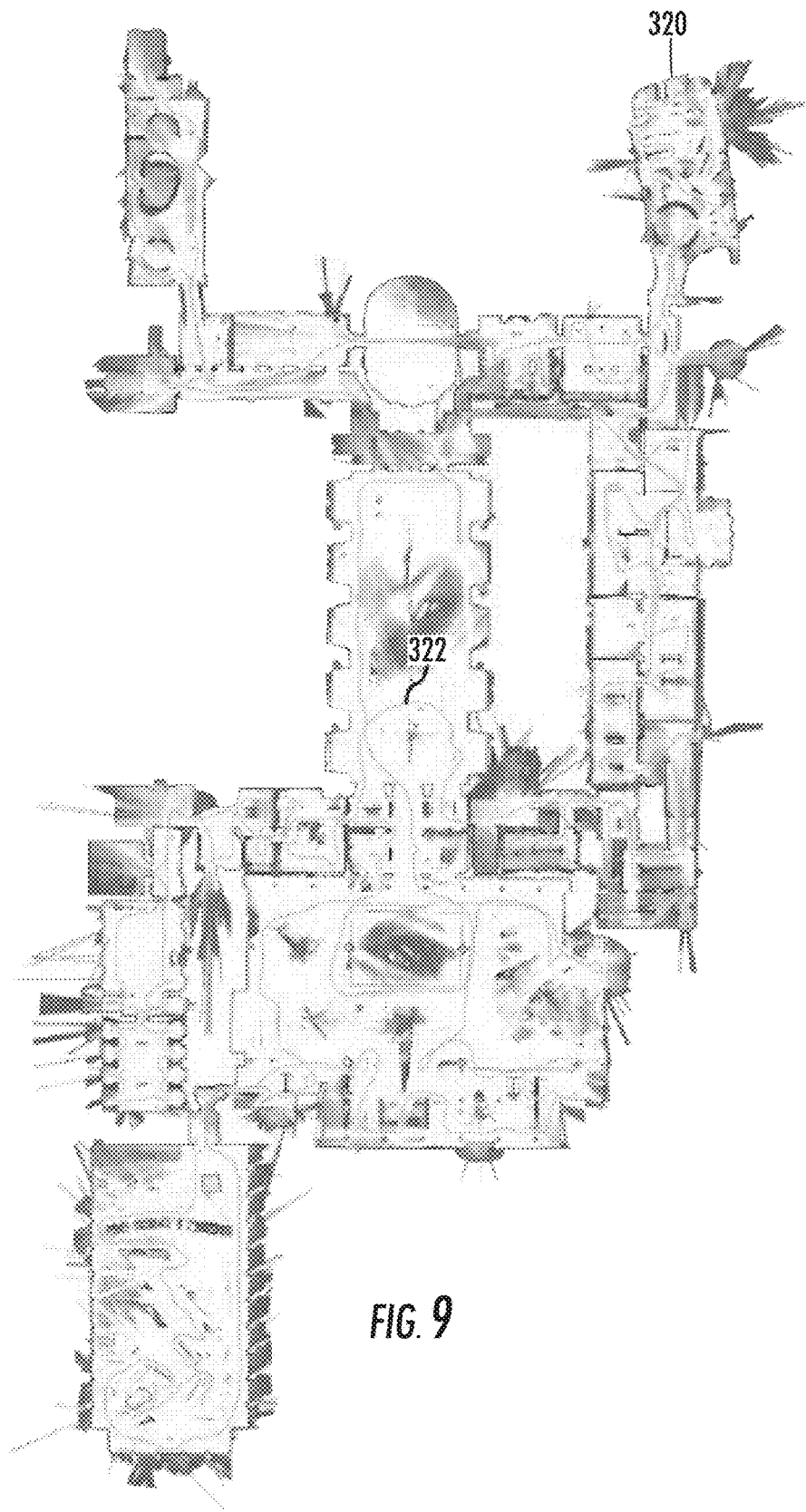
FIG. 9 provides an example overview of a cartographer map generated according to example aspects of the present disclosure.

Referring again to FIG. 3, loop closure detection examples as described above can be used to provide different helpful outputs. In one example, a floorplan map including one or more submaps can be generated at (214) and provided for display at (216). An exemplary depiction of such a floorplan map 320 is provided in FIG. 9 and includes an exemplary route 322 traveled by a mobile cartographer system operator to obtain data scans used to generate the floorplan map 320. In some examples, the operator of a mobile cartographer system can see a floorplan map 320 such as depicted in FIG. 9 in phases as it is being created. In some examples, the floorplan map 320 can be viewed on a mobile computing device 170 while the operator is walking through a building or other given environment.

Figure 10:
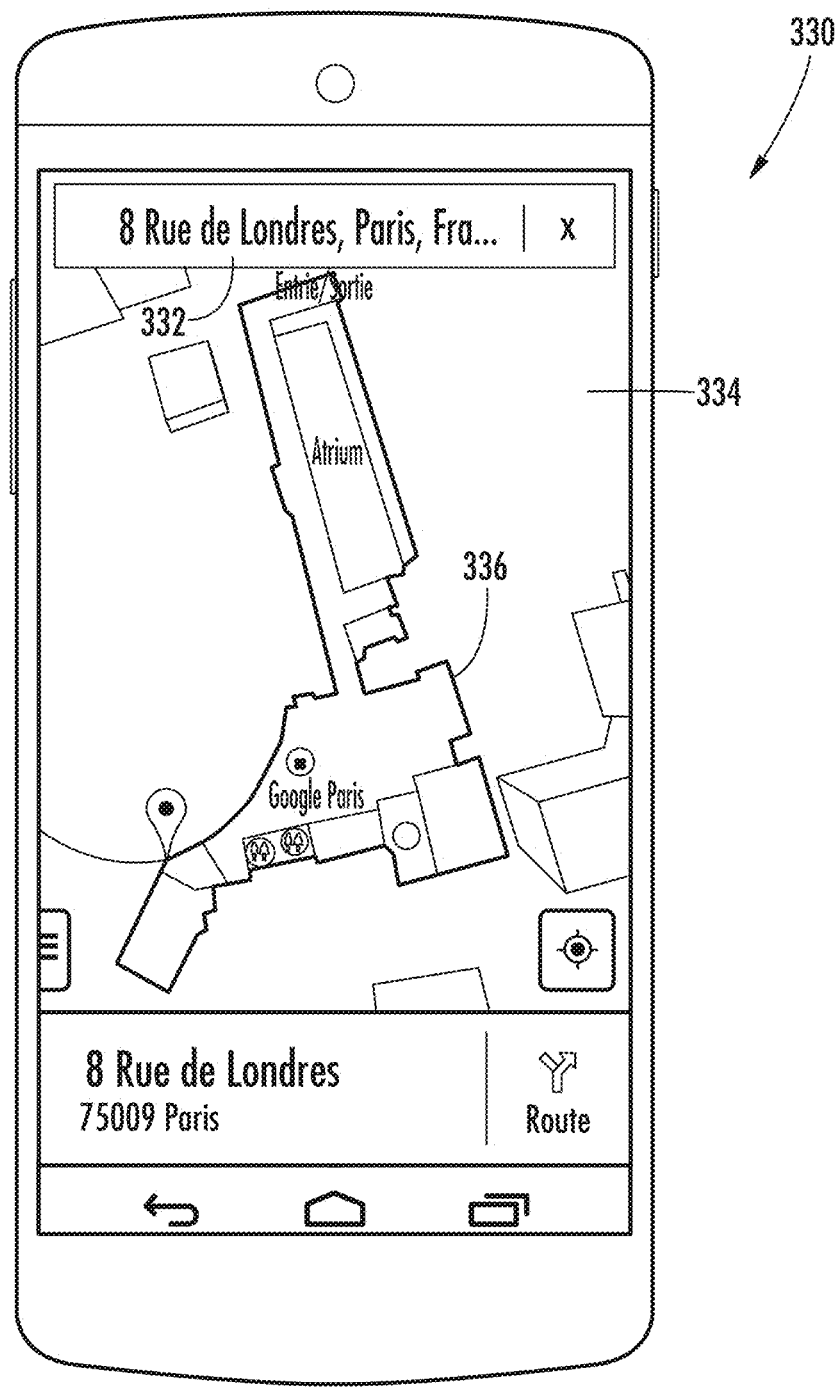
FIG. 10 depicts an example user interface for displaying SLAM information integrated within a mapping application according to example aspects of the present disclosure.

In some examples the floorplan map generated at (214) can be provided as an output at (216) within a mapping application such as depicted in FIG. 10. The example of FIG. 10 illustrates how a person searching for directions or other information about a particular geographic location can be provided with access to a floorplan for a building or other listing at the particular geographic location via user interface 330. User interface 330 can include a browser search input 332 by which a user can enter a geographic location. A map 334 then can be generated to include a general navigational overview of the geographic location entered in browser search input 332, as well as a floor plan outline 336. In some examples, user selection of floorplan outline 336 can trigger display of a more detailed floorplan map such as shown in FIG. 9.

Referring still to FIG. 3, another example application of loop closure detection method (200) includes determining the given location at (218) associated with each of the one or more range measurement data scans accessed at (202). Determining a location at (218) can be based at least in part on the enhanced scan poses and enhanced submap poses determined at (208) and/or the one or more closed loops identified at (210). Outputs indicative of the determined given location associated with each range measurement data scan accessed at (202) can then be provided at (220).

The technology discussed herein makes reference to servers, databases, software applications, and other computer-based systems, as well as actions taken and information sent to and from such systems. One of ordinary skill in the art will recognize that the inherent flexibility of computer-based systems allows for a great variety of possible configurations, combinations, and divisions of tasks and functionality between and among components. For instance, server processes discussed herein can be implemented using a single server or multiple servers working in combination. Databases and applications can be implemented on a single system or distributed across multiple systems. Distributed components can operate sequentially or in parallel.

While the present subject matter has been described in detail with respect to specific example embodiments thereof, it will be appreciated that those skilled in the art, upon attaining an understanding of the foregoing can readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A computer-implemented method of detecting loop closure, comprising:
   accessing, by one or more computing devices, one or more range measurement data scans, each range measurement data scan comprising a collection of consecutively observed spatial data obtained at a given location;
   determining, by the one or more computing devices, a relative scan pose for each range measurement data scan;
   aligning, by the one or more computing devices, frames from each of the one or more range measurement data scans to frames within one or more submaps based at least in part by the determined relative scan pose;

periodically determining, by the one or more computing devices, an enhanced scan pose for each range measurement data scan and an enhanced submap pose for each submap;

identifying, by the one or more computing devices, one or more closed loops within the one or more submaps based at least in part on the periodically determined enhanced scan poses and enhanced submap poses, wherein the periodically determined enhanced scan poses and enhanced submap poses respectively include a translation and a rotation of the spatial data that periodically reduces error accumulated over time in the aligning of the frames; and providing, by the one or more computing devices, an output indicative of the identified one or more closed loops.

2. The method of claim 1, wherein aligning frames from each of the one or more range measurement data scans to frames within a submap comprises:

generating, by the one or more computing devices, a probability grid of discrete grid points;

calculating, by the one or more computing devices, a probability value for selected grid points in the probability grid, each probability value corresponding to a probability that the selected grid point is obstructed in a range measurement data scan;

identifying, by the one or more computing devices, grid points as hits or misses based at least in part on the calculated probability values; and aligning frames from each of the one or more range measurement data scans to frames within a submap based at least in part on the identified hits or misses.

3. The method of claim 2, wherein determining a relative scan pose for each range measurement data scan comprises determining a scan pose for each range measurement data scan that maximizes the probability values for all grid points of the range measurement data scan as aligned within a submap.

4. The method of claim 1, wherein determining a relative scan pose for each range measurement data scan and periodically determining an enhanced scan pose for each range measurement data scan and an enhanced submap pose for each submap respectively comprise solving a non-linear least squares problem.

5. The method of claim 1, wherein periodically determining an enhanced scan pose for each range measurement data scan and an enhanced submap pose for each submap comprises:

identifying, using the one or more computing devices, one or more constraints including the relative scan poses determined for each range measurement data scan and covariance matrices associated with the relative scan poses; and solving a non-linear least squares optimization formula using at least the one or more identified constraints.

6. The method of claim 5, wherein the non-linear least squares optimization formula is solved at least in part by using a branch and bound algorithm.

7. The method of claim 6, wherein the branch and bound algorithm employs a depth-first search (DFS) approach to node selection.

8. The method of claim 1, wherein periodically determining an enhanced scan pose for each range measurement data scan and an enhanced submap pose for each submap is performed at least once within a period of no more than ten seconds during which consecutively observed spatial data is obtained.

9. The method of claim 1, wherein the spatial data within each range measurement data scan includes a two-dimensional translation parameter and a rotation parameter, and wherein the rotational parameter of the scan is determined using a device configured to measure angular velocity while the consecutively observed spatial data is obtained.

10. The method of claim 1, further comprising generating, by the one or more computing devices, a floorplan map of the one or more submaps based at least in part on the determined enhanced scan poses, the determined enhanced submap poses and the identification of the one or more closed loops.

11. The method of claim 10, further comprising providing for display, by the one or more computing devices, a depiction of the floorplan map including selected submaps.

12. The method of claim 1, further comprising:

determining, by the one or more computing devices, the given location associated with each of the one or more range measurement data scans based at least in part on the enhanced scan poses, the enhanced submap poses and the identification of one or more closed loops; and providing, by the one or more computing devices, an output indicative of the determined given location associated with each of the one or more range measurement data scans.

13. A computing device, comprising:

one or more processors; and one or more memory devices, the one or more memory devices storing computer-readable instructions that when executed by the one or more processors, cause the one or more processors to perform operations, the operations comprising:

accessing one or more range measurement data scans, each range measurement data scan comprising a collection of consecutively observed spatial data obtained at a given location;

determining a relative scan pose for each range measurement data scan;

aligning frames from each of the one or more range measurement data scans to frames within one or more submaps based at least in part by the determined relative scan pose;

periodically determining an enhanced scan pose for each range measurement data scan and an enhanced submap pose for each submap;

identifying one or more closed loops within the one or more submaps based at least in part on the periodically determined enhanced scan poses and enhanced submap poses, wherein the periodically determined enhanced scan poses and enhanced submap poses respectively include a translation and a rotation of the spatial data that periodically reduces error accumulated over time in the aligning of the frames; and providing an output indicative of the identified one or more closed loops.

14. The computing device of claim 13, wherein determining a relative scan pose for each range measurement data scan and periodically determining an enhanced scan pose for each range measurement data scan and an enhanced submap pose for each submap respectively comprise solving a non-linear least squares problem.

15. The computing device of claim 14, wherein the non-linear least squares problem is solved at least in part by using a branch and bound algorithm.

16. The computing device of claim 13, wherein the operations further comprise:
- generating a floorplan map of the one or more submaps based at least in part on the determined enhanced scan poses, the determined enhanced submap poses and the identification of the one or more closed loops; and
- providing for display a depiction of the floorplan map including selected submaps.

17. The computing device of claim 13, wherein the operations further comprise:
- determining the given location associated with each of the one or more range measurement data scans based at least in part on the enhanced scan poses, the enhanced submap poses and the identification of one or more closed loops; and
- providing an output indicative of the determined given location associated with each of the one or more range measurement data scans.

18. One or more tangible, non-transitory computer-readable media storing computer-readable instructions that when executed by one or more processors cause the one or more processors to perform operations, the operations comprising:
- accessing one or more range measurement data scans, each range measurement data scan comprising a collection of consecutively observed spatial data obtained at a given location;
- determining a relative scan pose for each range measurement data scan;
- aligning frames from each of the one or more range measurement data scans to frames within one or more submaps based at least in part by the determined relative scan pose;
- periodically determining an enhanced scan pose for each range measurement data scan and an enhanced submap pose for each submap;
- identifying one or more closed loops within the one or more submaps based at least in part on the periodically determined enhanced scan poses and enhanced submap poses, wherein the periodically determined enhanced scan poses and enhanced submap poses respectively include a translation and a rotation of the spatial data that periodically reduces error accumulated over time in the aligning of the frames; and
- providing an output indicative of the identified one or more closed loops.

19. The computer-readable media of claim 18, wherein the operations further comprise:
- generating a floorplan map of the one or more submaps based at least in part on the determined enhanced scan poses, the determined enhanced submap poses and the identification of the one or more closed loops; and
- providing for display a depiction of the floorplan map including selected submaps.

20. The computer-readable media of claim 18, wherein the operations further comprise:
- determining the given location associated with each of the one or more range measurement data scans based at least in part on the enhanced scan poses, the enhanced submap poses and the identification of one or more closed loops; and
- providing an output indicative of the determined given location associated with each of the one or more range measurement data scans.

* * * * *